United States Patent
Kolodzey et al.

(10) Patent No.: US 6,593,194 B2
(45) Date of Patent: Jul. 15, 2003

(54) METAL-INSULATOR-SEMICONDUCTOR FIELD EFFECT TRANSISTOR HAVING AN OXIDIZED ALUMINUM NITRIDE GATE INSULATOR FORMED ON A GALLIUM NITRIDE OR SILICON SUBSTRATE, AND METHOD OF MAKING THE SAME

(75) Inventors: James Kolodzey, Landenberg, PA (US); Johnson Olowolafe, Bear, DE (US)

(73) Assignee: University of Delaware, Newark, DE (US)

( * ) Notice: Subject to any disclaimer, the term of this patent is extended or adjusted under 35 U.S.C. 154(b) by 148 days.

(21) Appl. No.: 09/923,091

(22) Filed: Aug. 6, 2001

(65) Prior Publication Data
US 2002/0098658 A1 Jul. 25, 2002

Related U.S. Application Data

(62) Division of application No. 09/268,287, filed on Mar. 15, 1999, now Pat. No. 6,297,538.
(60) Provisional application No. 60/078,947, filed on Mar. 23, 1998.

(51) Int. Cl.[7] .............................................. H01L 21/336
(52) U.S. Cl. ...................... 438/287; 438/197; 438/181
(58) Field of Search ................................ 438/287, 197, 438/181; 257/410, 411, 213, 288, 289

(56) References Cited

U.S. PATENT DOCUMENTS

| | | |
|---|---|---|
| 3,925,121 A | 12/1975 | Touchy |
| 4,144,634 A | 3/1979 | Chang et al. |
| 4,216,036 A | 8/1980 | Tsang |
| 4,542,073 A | 9/1985 | Tanaka et al. |
| 4,784,702 A | 11/1988 | Henri |
| 5,024,962 A | 6/1991 | Murray et al. |
| 5,122,930 A | 6/1992 | Kondo et al. |
| 5,169,796 A | 12/1992 | Murray et al. |
| 5,262,360 A | 11/1993 | Holonyak, Jr. et al. |
| 5,334,544 A | 8/1994 | Matsuoka et al. |
| 5,336,361 A | 8/1994 | Tamura et al. |
| 5,397,719 A | 3/1995 | Kim et al. |
| 5,432,128 A | 7/1995 | Tsu |
| 5,466,488 A | 11/1995 | Toyoda et al. |
| 5,504,039 A | 4/1996 | Grivna |
| 5,523,589 A | 6/1996 | Edmond et al. |
| 5,578,839 A | 11/1996 | Nakamura et al. |
| 5,616,947 A | 4/1997 | Tamura |
| 5,929,467 A * | 7/1999 | Kawai et al. ............... 257/192 |
| 5,990,531 A * | 11/1999 | Taskar et al. ............... 257/410 |
| 6,140,169 A * | 10/2000 | Kawai et al. ............... 438/197 |

FOREIGN PATENT DOCUMENTS

JP  402230772  9/1990

* cited by examiner

Primary Examiner—Tom Thomas
Assistant Examiner—Thomas Magee
(74) Attorney, Agent, or Firm—Connolly Bove Lodge & Hutz LLP

(57) ABSTRACT

A method for making a metal-insulator-semiconductor field effect transistor (MISFET) having an oxidized aluminum nitride gate insulator formed on a silicon or gallium nitride substrate. The method of making the MISFET comprises the steps of depositing an aluminum nitride layer on the entire upper surface of the silicon or gallium nitride substrate. Subsequently, the aluminum nitride layer is oxidized to convert it into an oxidized aluminum nitride layer which acts as a gate insulator of the MISFET. Portions of the oxidized aluminum nitride layer are etched to form a plurality of openings that expose regions to become the source and drain regions of the substrate. The source and drain regions are formed in the plurality of openings by conventional techniques including diffusion and ion-implantation. Finally, a metal layer is formed in the plurality of openings of the oxidized aluminum nitride layer, wherein the metal layer contacts the source and drain regions of the substrate.

8 Claims, 1 Drawing Sheet

METAL-INSULATOR-SEMICONDUCTOR FIELD EFFECT TRANSISTOR HAVING AN OXIDIZED ALUMINUM NITRIDE GATE INSULATOR FORMED ON A GALLIUM NITRIDE OR SILICON SUBSTRATE, AND METHOD OF MAKING THE SAME

This present application is a divisional application of application Ser. No. 09/268 287 now U.S. Pat. No. 6,297,538, filed Mar. 15, 1999, which is based upon provisional application Serial No. 60/078,947, filed Mar. 23, 1998.

BACKGROUND OF THE INVENTION

A. Field of the Invention

The present invention relates generally to a semiconductor device, and more specifically to a metal-insulator-semiconductor field effect transistor (MISFET) having an oxidized aluminum nitride gate insulator formed on a silicon or gallium nitride semiconductor substrate, and a method of making the same.

B. Discussion of the Related Art

Manufacture of a conventional MIS (metal-insulator-semiconductor)-type semiconductor device involves forming a gate insulator on a semiconductor substrate, and subsequently forming a gate electrode on the gate insulator. Typically, the semiconductor substrate consists of silicon (Si) or gallium arsenide (GaAs), and the gate insulator comprises a film of $SiO_2$, SiN, AlN, or the like, directly deposited on the substrate.

Conventional MISFETs include a silicon dioxide ($SiO_2$) gate insulator deposited on a silicon substrate. However, it is preferable that MISFETs utilize an insulator made from a material other than $SiO_2$, and a substrate made from a material other than silicon. For example, substrates made from a gallium nitride-based compound semiconductors such as, gallium nitride (GaN), gallium aluminum nitride (GaAlN), and indium gallium nitride (InGaN), are preferable since such substrates have direct band gaps in the range of 1.95 eV to 6 eV. For this reason, these compound semiconductors are promising as materials for light-emitting devices such as light-emitting diodes and laser diodes, and for high operating temperature circuits.

Unfortunately, when a silicon dioxide gate insulator is deposited on a gallium nitride substrate or a substrate made from a material other than silicon, the electrical properties of the deposited silicon dioxide gate insulator erode the performance of the conventional MISFET. Thus, a MISFET structure on a GaN substrate is not practical and will have poor performance characteristics.

The reason for this is that the best oxides for use as gate insulators in MISFETs are thermally formed by the chemical reaction of oxygen ($O_2$) gas with the surface of the MISFET substrate. Such native oxides, as they are conventionally called, are not chemically stable for all materials. Further, semiconductor materials that form good FETs and react with oxygen to form a good gate insulator rarely exist. For example, a pure gallium nitride substrate will not react directly with oxygen to form stable oxides. Rather, the gallium nitride reacts with oxygen to form a nitrous oxide (NO) gas and water-soluble $Ga_2O_3$. This creates reliability problems because the $Ga_2O_3$ will absorb water ($H_2O$) from the ambient environment, changing its electrical behavior. The electrical behavior of the transistor will change too, rendering it unstable and unreliable over time. The unstable transistor will render unstable the circuit incorporating the transistor.

SUMMARY OF THE INVENTION

An object of the present invention, therefore, is to provide a MISFET that effectively utilizes a gallium nitride or silicon substrate. A further object of the present invention is to provide a MISFET which forms a stable FET and which is capable of reacting with oxygen to form a good gate insulator.

A still further object of the present invention is to provide a MISFET which permits complex logic circuits to operate at higher temperatures and in harsher environments than conventional silicon-based circuits.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, the invention comprises a metal-insulator-semiconductor type device comprising: one of a silicon or a gallium nitride substrate having source and drain regions formed in an upper surface; an oxidized aluminum nitride layer formed on the upper surface of the substrate and having a plurality of openings formed therein so to expose the source and drain regions of the substrate; and a metal layer formed in the plurality of openings of the oxidized aluminum nitride layer, the metal layer contacting the source and drain regions of the substrate.

According to another aspect, the invention comprises a method for making a metal-insulator-semiconductor type device, comprising the steps of: depositing an aluminum nitride layer on an upper surface of one of a silicon or gallium nitride substrate; oxidizing the aluminum nitride layer to convert the aluminum nitride layer into an oxidized aluminum nitride layer; etching portions of the oxidized aluminum nitride layer to form a plurality of openings exposing regions of the substrate; forming source and drain regions in an upper surface of the substrate corresponding to the exposed regions of the substrate; and forming a metal layer in the plurality of openings of the oxidized aluminum nitride layer, the metal layer contacting the source and drain regions of the substrate.

It is to be understood that the foregoing general description and the following detailed description are exemplary and explanatory only and are not restrictive of the invention as claimed.

BRIEF DESCRIPTION OF THE DRAWINGS

The accompanying drawings are included to provide a further understanding of the invention and are incorporated in and constitute part of the specification, illustrate a preferred embodiment of the invention, and, together with a description, serve to explain the principles of the invention. In the drawings.

DETAILED DESCRIPTION OF THE PREFERRED EMBODIMENT

Figure 1A:
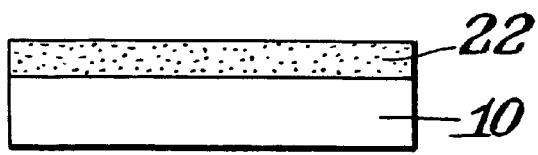
FIGS. 1(*a*)–1(*f*) are cross-sectional views of the manufacturing steps for making the MISFET in accordance with the preferred embodiment of the present invention.

Reference will be made in detail to the present preferred embodiment of the invention, an example of which is illustrated in the accompanying drawings. Like reference numerals refer to like parts in the various figures of the drawings.

The present invention is directed to a metal-insulator-semiconductor field effect transistor (MISFET) and a method of making the same. In the disclosed embodiment, the MISFET includes an oxidized aluminum nitride gate insulator deposited on a gallium nitride or silicon or other substrate. The general purpose of such a MISFET is to perform the typical functions of a transistor including operation as an amplifier, logic gate or switch to control electrical signals in an integrated circuit. The MISFET is suitable for use in computer logic circuits, memory circuits, and optical communication circuits to provide signals that drive light emitting diodes and laser diodes in transmitter circuits and to amplify the signals from photodiodes in receiver circuits. Using the oxidized aluminum nitride (AlN), disclosed herein, the MISFET can operate at significantly higher temperatures of up to 450 degrees centigrade.

The method of making the MISFET of present invention comprises the first step of depositing an aluminum nitride (AlN) layer 22 on the entire upper surface of a substrate 10 using standard epitaxial techniques, such as chemical vapor deposition, molecular beam epitaxy, or sputtering, as shown in FIG. 1(a). The substrate 10 can be either a p-type impurity doped or an n-type impurity doped silicon (Si) or gallium nitride (GaN) substrate. The aluminum nitride layer 22 used since aluminum nitride is compatible with silicon and gallium nitride substrates, since very low defect densities are produced with these combinations.

Figure 1B:
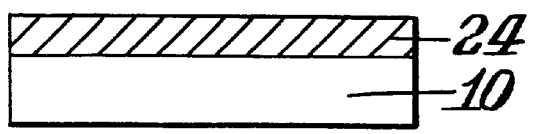

Aluminum nitride layer 22 is oxidized by inserting the substrate shown in FIG. 1(a), into a conventional oxidation furnace having a dry oxygen ($O_2$) flow to form an oxidized aluminum nitride (Al:O:N) layer 24, as shown in FIG. 1(b). The oxidation furnace is typically a quartz tube several meters long with a diameter large enough to accommodate the substrate size. Thermal heaters surround the quartz diffusion tube and provide uniform, controllable temperatures up to nearly 1200° C. In order to oxidize aluminum nitride layer 22, preferably temperatures from 900 to 1100° C. are used for durations of less than one hour. It has been found that a temperature of 1000° C. for one hour will oxidize 500 nm of aluminum nitride. Accordingly, thinner layers of aluminum nitride may be oxidized at proportionally shorter times, but the relationship between time and oxide thickness is not linear. For practical applications, aluminum nitride layer 22 preferably will be less than 10 nm thick. Furthermore, aluminum nitride layer 22 and oxidized aluminum nitride layer 24 have approximately the same thickness. Oxidized aluminum nitride layer 24 forms the gate insulator for the MISFET of the present invention.

Figure 1C:
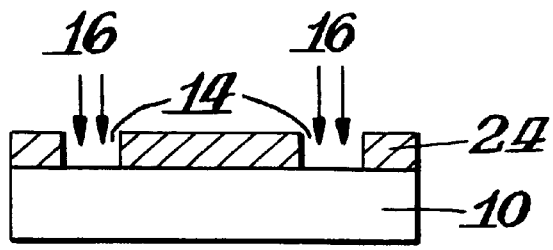
Figure 1D:
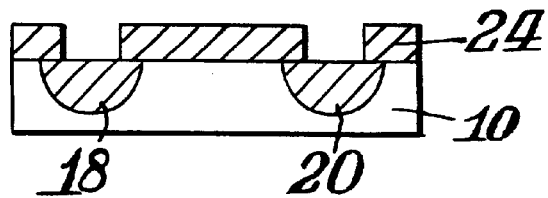

As shown in FIG. 1(c), using conventional photolithography, oxidized aluminum nitride layer 24 is patterned and etched to form openings 14 exposing the upper surface regions of substrate 10 where source and drain regions are to be formed. The conventional photolithographic process is first used to coat the oxide layer 24 with a light-sensitive liquid polymer called photoresist. This is performed using a conventional spinning process. The photoresist is then exposed to light in regions with a patterned photomask having a transparent quartz plate and opaque metal lines of chromium (Cr). The conventional instrument used to expose the photoresist with the pattern contained in the photomask is called a mask aligner. The mask aligner contains a source of ultraviolet light which exposes the photoresist on the photomask regions not blocked by the opaque metal lines. Using a conventional chemical developer, the photoresist is chemically treated to form openings in oxidized aluminum nitride layer 24 for exposing regions of substrate 10 where a source and drain are intended to be formed. These exposed regions of oxidized aluminum nitride layer 24 can be etched away using conventional acid etchants, resulting the configuration shown in FIG. 1(c). The regions of oxidized aluminum nitride layer 24 covered by the photoresist are protected against attack by the acid etchants.

As shown in FIG. 1(c), the method further comprises the step of bombarding the upper surface regions of substrate 10 with p-type or n-type dopant ions 16. For silicon substrates, the dopant ions preferably comprise either arsenic (As) or phosphorus (P) for n-type doping, and boron (B) for p-type doping. For gallium nitride substrates, the dopant ions preferably comprise calcium (Ca), magnesium (Mg) or zinc (Zn) for p-type doping. For n-type doping it is possible that silicon (Si) or tin (Sn) can be used as n-type dopants in gallium nitride substrates. The impurity type of ions 16 are the opposite of the impurity type of gallium nitride or silicon substrate 10. Thus, if gallium nitride or silicon substrate 10 is p-type impurity doped, then n-type impurity-doped ions are used, and vice versa. Dopant ions 16 are either implanted, using conventional ion implantation techniques, or diffused, using conventional diffusion techniques, into the surface of substrate 10 so to form source region 18 and drain region 20.

The diffusion process can be performed in a conventional diffusion furnace at temperatures near 1000° C. and in an atmosphere of ionized gases containing the desired dopant atoms. Alternatively, ion implantation can be performed in which the ionized gases are accelerated to energies in the range from kilovolts to megavolts depending upon the desired implantation depth of the dopants. The implantation dose may also be adjusted for the desired doping concentration.

Figure 1E:
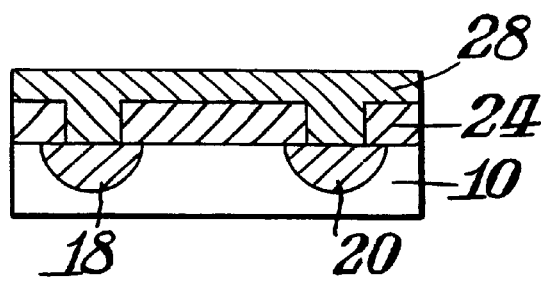
Figure 1F:
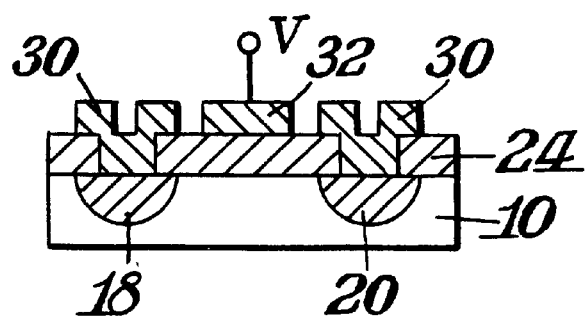

Subsequently, as shown in FIG. 1(e), a metallization process forms a metal layer 28 over the entire surface of the MISFET so to cover oxidized aluminum layer 24, as well as source and drain regions 18, 20. Metal layer 28 preferably comprises aluminum (Al), copper (Cu), or gold (Au). As seen in FIG. 1(f), a conventional patterning technique, such as photolothographic lift-off, patterns metal layer 28 to form metal patterns 30 over source and drain regions 18, 20 and another gate metal pattern 32 for connecting the MISFET to a gate voltage source V.

The completed MISFET of the present invention, as shown in FIG. 1(f), comprises gallium nitride or silicon substrate 10 having source and drain regions 18, 20 formed in an upper surface of substrate 10. An oxidized aluminum nitride layer 24 is formed on the upper surface of substrate 10 and has openings 14 formed therein so to expose source and drain regions 18, 20 of substrate 10. The MISFET of the present invention further comprises metal patterns 30 formed in openings 14 of oxidized aluminum nitride layer 24, wherein metal patterns 30 contact source and drain regions 18, 20 of substrate 10, and another metal pattern 32 formed on an upper surface of oxidized aluminum nitride layer 24 for connecting the MISFET to voltage source V. As a transistor, the benefits of a MISFET are its high amplification factor of output current-to-input voltage (also known as "transconductance") and its relatively low gate currents due to the gate insulator (oxidized aluminum nitride layer 24). The gate insulator has a low defect density comparable to the best silicon dioxide layers. The gate insulator also has a high dielectric breakdown strength, with a breakdown field above three million volts per centimeter, which is lower than the value of silicon dioxide but still adequate for transistor applications.

The MISFET of the present invention is useful for various applications. For example, electronic designs are currently under consideration for new high density compact disks having logic circuits with silicon-based packages that interconnect with gallium nitride blue light-emitting lasers in expensive multi-chip packages. Using the MISFET of the present invention, electronic manufacturers could fabricate MIS-type transistor circuits from the same gallium nitride material used in blue light-emitting lasers. Thus, MISFET circuits in accordance with the present invention and lasers can be made on the same gallium nitride substrate to produce more reliable, less expensive packages.

Furthermore, the MISFET of the present invention is very useful for light-emitting devices such as light-emitting diodes and laser diodes, since the gallium nitride substrate has a high band gap energy range of 3.5 electron-volts (eV). Also, since the gallium nitride substrate has a high band gap energy, the MISFET of the present invention has good electrical properties even at high temperatures, such as 450° C., while maintaining good electrical properties. Thus, the MISFET of the present invention would permit complex logic circuits to operate at higher temperatures and in harsher environments than conventional Si-based circuits.

It will be apparent to those skilled in the art that various modifications and variations can be made to the MISFET of the present invention without departing from the scope or spirit of the invention. Thus, it is intended that the present invention cover the modifications and variations of this invention provided they come within the scope of the appended claims and their equivalents.

What is claimed is:

1. A method for making a metal-insulator-semiconductor type device, comprising the steps of:

depositing an aluminum nitride layer on an upper surface of one of a silicon or gallium nitride substrate;

oxidizing the aluminum nitride layer to convert the aluminum nitride layer into an oxidized aluminum nitride layer;

etching portions of the oxidized aluminum nitride layer to form a plurality of openings exposing regions of the substrate;

forming source and drain regions in an upper surface of the substrate corresponding to the exposed regions of the substrate; and forming a metal layer in the plurality of openings of the oxidized aluminum nitride layer, the metal layer contacting the source and drain regions of the substrate.

2. A method for making a metal-insulator-semiconductor type device as recited in claim 1, wherein the source and drain regions are formed by one of implanting and diffusing ions into the upper surface of the substrate.

3. A method for making a metal-insulator-semiconductor type device as recited in claim 2, wherein the substrate comprises one of a p-type impurity-doped gallium nitride or silicon or other substrate and the ions comprise n-type impurity-doped ions, including one of arsenic and phosphorous for silicon substrates, and one of silicon and tin for gallium nitride substrates.

4. A method for making a metal-insulator-semiconductor type device as recited in claim 2, wherein the substrate comprises one of an n-type impurity-doped gallium nitride or silicon or other substrate and the ions comprise p-type impurity-doped ions, including boron for silicon substrates, and one of calcium, magnesium, and zinc for gallium nitride substrates.

5. A method for making a metal-insulator-semiconductor type device as recited in claim 1, wherein the metal-insulator-semiconductor device is a field effect transistor.

6. A method for making a metal-insulator-semiconductor type device as recited in claim 1, wherein the oxidized aluminum nitride layer is formed by thermally reacting oxygen with the aluminum nitride layer deposited on the substrate surface.

7. A method for making a metal-insulator-semiconductor type device as recited in claim 1, wherein the metal layer comprises metal patterns formed in the openings of the oxidized aluminum nitride layer for contacting the source and drain regions, and another metal pattern formed on an upper surface of the oxidized aluminum nitride layer for connecting the metal-insulator-semiconductor device to a gate voltage source.

8. A method for making a metal-insulator-semiconductor device as recited in claim 1, wherein the oxidized aluminum nitride layer acts as a gate insulator for the metal-insulator-semiconductor device.

* * * * *